United States Patent
Henriksen et al.

(10) Patent No.: US 11,870,371 B2
(45) Date of Patent: Jan. 9, 2024

(54) DETERMINING AND APPLYING A VOLTAGE TO A PIEZOELECTRIC ACTUATOR

(71) Applicant: Polight ASA, Horten (NO)

(72) Inventors: Lars Henriksen, Tønsberg (NO); Tore Svortdal, Horten (NO); Euan Barron, Nairn (GB); Muhammad Asif Raza Azhar, Tampere (FI); Thi Kim Trinh Tran, Undrumsdal (NO); Nicolas Tallaron, Lyons (FR); Pierre Craen, Embourg (BE)

(73) Assignee: Polight ASA, Horten (NO)

( * ) Notice: Subject to any disclaimer, the term of this patent is extended or adjusted under 35 U.S.C. 154(b) by 783 days.

(21) Appl. No.: 16/978,561

(22) PCT Filed: Mar. 7, 2019

(86) PCT No.: PCT/EP2019/055653
§ 371 (c)(1),
(2) Date: Sep. 4, 2020

(87) PCT Pub. No.: WO2019/170793
PCT Pub. Date: Sep. 12, 2019

(65) Prior Publication Data
US 2021/0021212 A1    Jan. 21, 2021
US 2021/0336560 A9    Oct. 28, 2021

(30) Foreign Application Priority Data

Mar. 7, 2018    (EP) .................................. 18160414

(51) Int. Cl.
*H02N 2/06*    (2006.01)
*H04N 23/52*    (2023.01)
(Continued)

(52) U.S. Cl.
CPC ............. *H02N 2/062* (2013.01); *H04N 23/52* (2023.01); *H04N 23/54* (2023.01); *H04N 23/57* (2023.01);
(Continued)

(58) Field of Classification Search
CPC ........... H02N 2/02; H02N 2/06; H02N 2/062; H10N 30/802; G03B 2205/0053;
(Continued)

(56) References Cited

U.S. PATENT DOCUMENTS

| 4,862,207 A | 8/1989 | Asakura et al. |
| 2009/0189485 A1* | 7/2009 | Iyoki ................. H10N 30/2027 310/317 |

(Continued)

FOREIGN PATENT DOCUMENTS

| EP | 3190637 A1 | 7/2017 |
| WO | WO 2017/118732 A1 | 7/2017 |

OTHER PUBLICATIONS

Changhai, Ru et al., (NPL)—"Hysteresis and creep compensation for piezoelectric actuator in open-loop operation". See Sensors and Actuators A, May 2005, pp. 124-130, vol. 122.*

(Continued)

*Primary Examiner* — Twyler L Haskins
*Assistant Examiner* — Akshay Trehan
(74) *Attorney, Agent, or Firm* — Knobbe Martens Olson & Bear LLP (57) ABSTRACT

The invention relates to a method and an actuator system for determining and applying a voltage to a piezoelectric actuator (PEA) to achieve a given setpoint displacement. The method involves determining a relation $d_{cal}(V)$ between a PEA displacement measure (d) and voltage (V) and a relation $tt_{cal}(V)$ between transition time (tt) and voltage and combining the determined relations to calculate a relation (Continued)

d(tt) between the displacement measure and transition time during an initial calibration procedure. This relation is characteristic for the PEA, and by determining a new relation $tt_{new}(V)$ after repeated biasing of the PEA, a compensated relation $d_c(V)$ can be calculated by substituting $tt_{new}(V)$ in the calculated d(tt). The compensated relation $d_c(V)$ compensates for piezo creep effects due to the wear and can be used to determine the voltage to be applied directly, or be used in other compensation algorithms.

13 Claims, 8 Drawing Sheets (51) Int. Cl.
*H04N 23/67* (2023.01)
*H10N 30/80* (2023.01)
*H04N 23/54* (2023.01)
*H04N 23/57* (2023.01)
*G02B 7/08* (2021.01)

(52) U.S. Cl.
CPC ........... *H04N 23/67* (2023.01); *H10N 30/802* (2023.02); *G02B 7/08* (2013.01); *G03B 2205/0061* (2013.01)

(58) Field of Classification Search
CPC .. G03B 2205/061; H04N 23/52; H04N 23/54; H04N 23/55; H04N 23/57; H04N 23/67; G02B 7/08
See application file for complete search history.

(56) References Cited

U.S. PATENT DOCUMENTS

2012/0212099 A1* 8/2012 Tajima ................ H10N 30/802
310/317
2018/0367065 A1* 12/2018 Svortdal ............ G02B 26/0875

OTHER PUBLICATIONS

Kuhnen, Klaus et al., (NPL)—"Compensation of Complex Hysteresis and Creep Effects in Piezoelectrically Actuated Systems—A New Preisach Modeling Approach". See IEEE Transactions on Automatic Control, Mar. 2009, pp. 537-550, vol. 54, No. 3.*

Changhai, Ru et al., "Hysteresis and creep compensation for piezoelectric actuator in open-loop operation" Sensors and Actuators A, 2005, pp. 124-130, vol. 122.

Kuhnen, Klaus et al., "Compensation of Complex Hysteresis and Creep Effects in Piezoelectrically Actuated Systems—A New Preisach Modeling Approach" IEEE Transactions on Automatic Control. Mar. 2009, pp. 537-550, vol. 54, No. 3.

Minase, J. et al., "Adaptive identification of hysteresis and creep in piezoelectric stack actuators" Int J Adv Manuf Technol, 2010, pp. 913-921, vol. 46.

International Search Report for PCT/EP2019/055653 dated Jun. 3, 2019.

* cited by examiner

DETERMINING AND APPLYING A VOLTAGE TO A PIEZOELECTRIC ACTUATOR

CROSS REFERENCE TO RELATED APPLICATIONS

This application is a U.S. National Phase application of PCT International Application Number PCT/EP2019/055653, filed on Mar. 7, 2019, designating the United States of America and published in the English language, which is an International Application of and claims the benefit of priority to European Patent Application No. 18160414.1, filed on Mar. 7, 2018. The disclosures of the above-referenced applications are hereby expressly incorporated by reference in their entireties.

FIELD OF THE INVENTION

The invention relates to piezoelectric actuators (PEAs) and systems involving such PEAs, in particular the invention relates to compensating for non-linear phenomena in such systems.

BACKGROUND OF THE INVENTION

WO 2017/118732 describes an electronic circuit for controlling charging of a piezoelectric load arranged as an actuator in a deformable lens.

Hysteresis and piezo creep are well known problems of PEAs. Piezo creep is the expression of the slow realignment of the crystal domains in a constant input voltage over time. If the operating voltage of a PZT is changed, after the voltage change is complete, the remnant polarization continues to change, manifesting itself in a slow creep. In closed loop setups—where the output is repeatedly checked against a desired value in a feedback loop to correct the voltage applied to the PEA—they can relatively easy be compensated for. The price, however, is time and power consumption which are disadvantageous for many applications.

Several approaches for open loop compensation for hysteresis and creep have been suggested, see e.g. Changhai et al. "Hysteresis and creep compensation for piezoelectric actuator in open-loop operation", Sensors and Actuators A 122 (2005) 124-130. These methods are disadvantageous in that they are difficult to implement in ASICs.

The present invention is an alternative to the prior art.

SUMMARY OF THE INVENTION

It is an object of the invention to provide a method and a system for open loop compensation for creep and/or hysteresis in PEAs that is particularly suited for actuator systems that need to operate fast and with small power consumption.

It is another object of the invention to provide such method and system for an adjustable focus lens assembly.

In a first aspect, the invention provides a method for determining and applying a voltage to a piezoelectric actuator (PEA) to achieve a given setpoint displacement, the method comprising:

- determining, during an initial calibration procedure, a relation $d_{cal}(V)$ between a PEA displacement measure (d) and voltage (V) and a relation $tt_{cal}(V)$ between transition time (tt) and voltage, where the transition time is a charging or discharging time $\Delta T$ between two voltages $V_A$ and $V_B$ applied to the PEA, and where the relations are determined for both increasing and decreasing voltages to map hysteresis, and combining the determined relations to calculate a relation d(tt) between the displacement measure and transition time;
- determining, after repeated biasing of the PEA, a new relation $tt_{new}(V)$ between transition time and voltage, and substituting $tt_{new}(V)$ in the calculated d(tt) to calculate a compensated relation $d_c(V)$;
- providing a setpoint displacement measure, $d_{sp}$ or voltage $V_s$;
- determining, using the compensated relation, $d_c(V)$, a voltage to be applied to the PEA to achieve $d_{sp}$ or a displacement measure derived from $V_s$;
- applying the determined voltage to the PEA.

In the present description, The PEA displacement measure is any direct or indirect measure of the PEA displacement, such as a parameter proportional thereto or to which there is a known relation. In the case of a PEA controlling a tunable lens, the displacement measure may be optical power, a sharpness score, focal length, etc.

Figure 1:
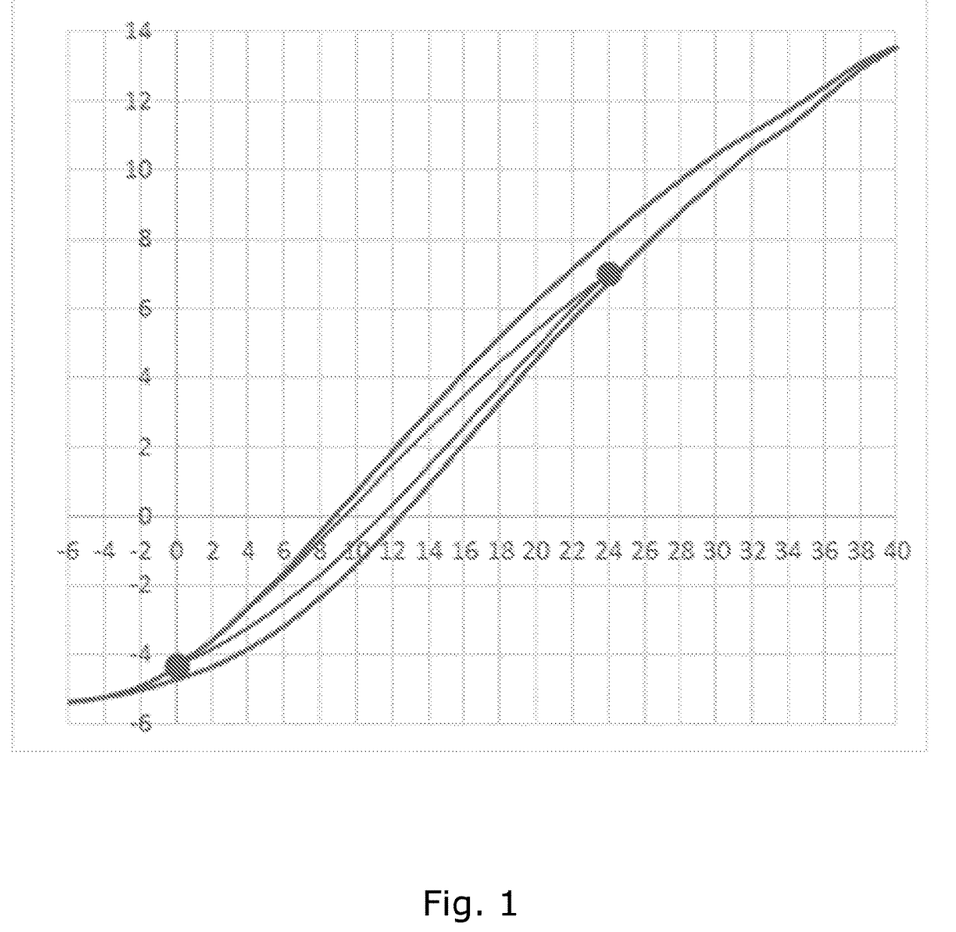
FIG. 1 is a graph illustrating a typical hysteresis curve d(V) between a PEA displacement measure (d) and voltage (V). Here, voltage is starting at −6V and is then stepwise increased up to 40V, then stepwise down to −6V again. The maximum hysteresis in V-direction can typically be in the range of 3-7V. In normal use, a reduced voltage range is used, and the hysteresis curve will typically lie within the envelope created by this full range curve, as indicated by the smaller envelope.

The method presumes a previously determined relation d(V) between voltage and displacement, which is a common characterization for PEAs, see also FIG. 1. As PEAs are prone to hysteresis effects, d(V) typically show hysteresis and is usually required when compensating for hysteresis. Such relations can be determined and expressed in different ways—e.g. tables, curves, interpolated curves, algebraic functions, etc. —and is considered part of the state of the art. Examples of analysis and further description of hysteresis and creep in PEAs may be found in Minase et al. "Adaptive identification of hysteresis and creep in piezoelectric stack actuators", Int J Adv Manuf Technol (2010) 46:913-921 or in Kuhnen and Krejci "Compensation of complex hysteresis and creep effects in Piezoelectric actuated systems", IEEE Transactions on Automatic Control (2009) 54.

The method according to the first aspect provides the advantage that the calculated relation d(tt) between the displacement measure and transition time at the same time characterises the individual PEA, has no hysteresis, and does not vary with time or usage of the PEA. This is in contrast to the relations used to calculate d(tt), which both have significant hysteresis and are both prone to change with time and usage history. By determining a current version of one of these relations at a later stage, the other can be derived using d(tt), thus compensating for the changes. It is important to note that the transition time is one of more related properties of the PEA that can be used for this purpose. The capacitance of a PEA is a function of the geometry and the dielectric permittivity of the material, and is thus more or less a material parameter, but not necessarily trivial to measure without a sophisticated measurement set-up. The transition time (the time to charge or discharge the PEA) is strongly correlated with capacitance, and can be used as a method to measure the capacitance.

The determination of relation $d_{cal}(V)$ during the initial calibration procedure preferably comprises determining at least two calibration pairs by measuring voltages corresponding to at least two calibration displacement measures, and fitting a typical d(V) curve to the determined calibration pairs.

Determining the relations between transition time and voltage preferably involves determining a transition time and voltage pair by measuring a PEA voltage at a time A, $V_A$, supplying or drawing a current to/from the PEA, measuring a PEA voltage at a later time B, $V_B$, and calculating $V=(V_B-V_A)/2$ and $tt=t_B-t_A$.

As mentioned previously, PEAs are generally prone to hysteresis, and the step of determining the voltage to be applied to the PEA preferably comprises using $d_c(V)$ in a hysteresis compensation algorithm to determine a hysteresis compensated voltage, $V_{hc}$, to be applied to the PEA to achieve $d_{sp}$. In a preferred embodiment, the hysteresis compensation algorithm is preferably a method according to the fifth aspect to be described later herein.

It is also important to note that many of the variables and parameters used in this and other aspects are temperature dependent, and need to be calibrated for the current temperature when used. The temperature dependencies are typically well-known. The current temperature may be determined in different ways known from the prior art. For example, the temperature dependence of the ASIC oscillator is significant, and can be used to estimate temperature. Since the oscillator frequency is used to measure tt, tt will also have a temperature dependence. But, since the temperature dependence of the oscillator is well characterized by the manufacturer, the temperature dependence of the transition time is easily calibrated out. In a preferred embodiment where the PEA actuator forms part of an adjustable focus lens assembly in a camera module, the step of determining the voltage to be applied to the PEA using the compensated relation, $d_c(V)$, comprises obtaining a current temperature and selecting a corresponding temperature compensation parameter for additional lenses in the camera module from a list.

In a preferred embodiment, the method further comprises recording a temperature of the PEA during the initial calibration and at the time of determining $tt_{new}(V)$, and compensating for the temperature dependencies of the determined relations before calculating the compensated relation $d_c(V)$.

In a preferred embodiment, the PEA is a piezo electric film arranged on a flexible membrane to deform a shape of the membrane upon actuation of the PEA.

It is preferred that the determination of the voltage to be applied to the PEA is an open-loop process, such as without a feedback loop where a displacement measure resulting from a voltage applied to the PEA is compared to the setpoint displacement measure.

In a second aspect, the invention provides an actuator system comprising a PEA, a piezo driver connected to drive the PEA, and a processing unit connected to the piezo driver and holding software for controlling the piezo driver, wherein the software is adapted to implement the method according to the first aspect.

In a third aspect, the invention provides an actuator system comprising a PEA, a piezo driver connected to drive the PEA, and a processing unit connected to the piezo driver and holding software for controlling the piezo driver, wherein:

the processing unit further holds a relation $d(tt)$ between a displacement measure (d) and transition time (tt) established during an initial calibration of the actuator system, where the transition time is a charging or discharging time $\Delta T$ between two voltages $V_A$ and $V_B$ applied to the PEA; and the software is adapted to, after repeated biasing of the PEA, control the driver to apply a sequence of voltages to the PEA and measure the transition times between the voltages to determine a relation $tt_{new}(V)$ between transition time and voltage (V), and to substitute $tt_{new}(V)$ in $d(tt)$ to calculate a compensated relation $d_c(V)$.

The piezo driver is an electronic circuit providing or drawing current to set the electric field over the piezo crystal, thus controlling the strain in the PEA. The piezo driver is preferably implemented in an ASIC.

In a preferred embodiment, the software is further adapted to:

receive a setpoint displacement measure, $d_{sp}$ or voltage $V_s$;

determine, using the compensated relation, $d_c(V)$, a voltage to be applied to the PEA to achieve $d_{sp}$ or a displacement measure derived from $V_s$;

send the determined voltage to a DAC in the piezo driver.

As for the method of the first aspect, the software carries out an open loop algorithm in that it determines the voltage to be applied to the PEA without a feedback loop where a displacement measure resulting from a voltage applied to the PEA is compared to the setpoint displacement measure.

In a preferred embodiment, the PEA actuator system is used to control an adjustable focus lens assembly in a camera module and the displacement measure is a sharpness score or focus distance of the camera module.

In another preferred embodiment, the PEA actuator system is combined with an adjustable focus lens assembly in a camera module and the PEA is a piezo electric film arranged on a flexible membrane of the adjustable focus lens assembly to deform a shape of the membrane upon actuation of the PEA.

In yet another preferred embodiment, the adjustable focus lens assembly comprises a bendable transparent lens cover, a transparent back window and a transparent, deformable lens body sandwiched between the lens cover and the back window to form a lens, and wherein the PEA a piezo film on the lens cover for changing an overall shape of the lens.

In a fourth aspect, the invention provides an adjustable focus lens assembly comprising a deformable, non-fluid lens body sandwiched between an optical support and a transparent, flexible membrane to form a lens, with a PEA in the form of a film arranged on the flexible membrane to deform the flexible membrane to change the focus of the lens, the lens assembly further comprising the actuator system according to the third aspect.

As already mentioned, PEAs are prone to hysteresis and determining the correct electric field to be applied preferably involves compensating for hysteresis. Thus, in a fifth aspect, the invention provides a method for compensating for hysteresis when applying a voltage to a piezoelectric actuator (PEA) in a tunable lens incorporating such PEA to control its optical power, the method comprising:

providing a relation $d(V)$ between a PEA displacement measure (d) and voltage (V) determined for both increasing, $d_\uparrow(V)$, and decreasing, $d_\downarrow(V)$, voltages to map hysteresis, the relation giving/showing/displaying maximum and minimum voltages, $V_{max}$ and $V_{min}$, as well as providing historical data comprising last upper and lower turning points, $V_{upper}$ and $V_{lower}$;

using a first hysteresis model function $d_n(V)$ with V being normalized as $$V_n = \left(\frac{V - V_{lower}}{V_{upper} - V_{lower}}\right);$$

$$d_{n\uparrow} = V_n^n$$

$$d_{n\downarrow} = 1-(1-V_n)^n, \text{ with } n \in ]1; 2[$$

and a second hysteresis model function $d_r(V)$ with V being normalized as $$V_r = \left(\frac{V - V_{min}}{V_{max} - V_{min}}\right);$$

$$d_r(V) = d_n(V) \cdot (d_n(V_{lower}) - d_n(V_{upper})) + d_n(V_{upper}),$$

determining a hysteresis ratio r:

$$r(V) = \frac{d_r(V) - V_r^n}{1 - (1 - V_r)^{1.1} - V_r^n};$$

providing a setpoint displacement measure, $d_{sp}$, for the PEA and determining a corresponding voltage, $V_s$, from $d_\uparrow(V)$, or providing a setpoint voltage, $V_s$, for the PEA and determining a corresponding displacement measure, $d_{sp}$, from $d_\uparrow(V)$;

selecting a search range as the interval $[V_{min}; V_{lower}]$, $[V_{lower}; V_{upper}]$, or $[V_{upper}; V_{max}]$ in which $V_s$ falls, and performing a binary search algorithm using the function $d_s(V) = d_\uparrow(V) + r(V)(d_\downarrow(V) - d_\uparrow(V))$ within the selected range and starting at $V_s$ to determine a hysteresis compensated voltage, $V_{hs}$, yielding a displacement measure within a preset threshold from $d_{sp}$;

applying the determined $V_{hs}$ to the PEA.

The exponent n can be empirically determined, and in a preferred embodiment, n ∈ ]1; 1,2] or preferably n=1,1.

In a preferred embodiment, providing a relation d(V) between a PEA displacement measure and voltage comprises using a compensated relation $d_c(V)$ using the method according to the first aspect.

BRIEF DESCRIPTION OF THE FIGURES

FIGS. 2A and B are graphs illustrating the piezo creep effect. They show the change in optical power at different voltage signals, as a function of time in operation with constant voltage. As can be seen in FIG. 2B, the effect is linear with log(time).

FIG. 3A shows d(V), FIG. 3B shows tt(V) and FIG. 3C shows d(tt).

FIG. 4A shows tt(V), FIG. 4B shows d(V) and FIG. 4C shows d(tt).

DETAILED DESCRIPTION OF THE INVENTION

In the following, various aspects and embodiments of the invention are described in relation to a PEA forming part of an adjustable focus lens assembly in a camera module.

The adjustable focus lens assembly can for example be a deformable, non-fluid lens body sandwiched between an optical support and a transparent, flexible membrane to form a lens, with a PEA in the form of a film arranged on the flexible membrane to deform the flexible membrane to change the focus of the lens. The PEA of the lens assembly can then be connected to a piezo driver involving a processing unit connected to the piezo driver and holding software for controlling the piezo driver. Such adjustable lens assembly is described in e.g. WO 2008/035983. The various measurements described and shown are obtained from a setup on a laboratory bench, and in this setup the displacement measure is optical power measured in dioptre. Measurement of optical power, however, is not practical in normal use of the invention, where other displacement measures, preferably a sharpness measure from an auto focus sensor, may be used. In the description, optical power (OP) and displacement measure (d) is used interchangeably.

For a tunable lens in a camera module setup using a PEA for lens deformation, three specific phenomena influence what voltage (DAC) to be set in order to reach a setpoint value with acceptable accuracy, these are:
  Hysteresis
  Piezo creep effect
  Thermal effects on the optical power of the lens and camera module optics.

A typical hysteresis curve—here displacement measure (d) versus voltage (V)—is shown in FIG. 1 and the concept thereof is well described in the prior art.

Figure 2A:
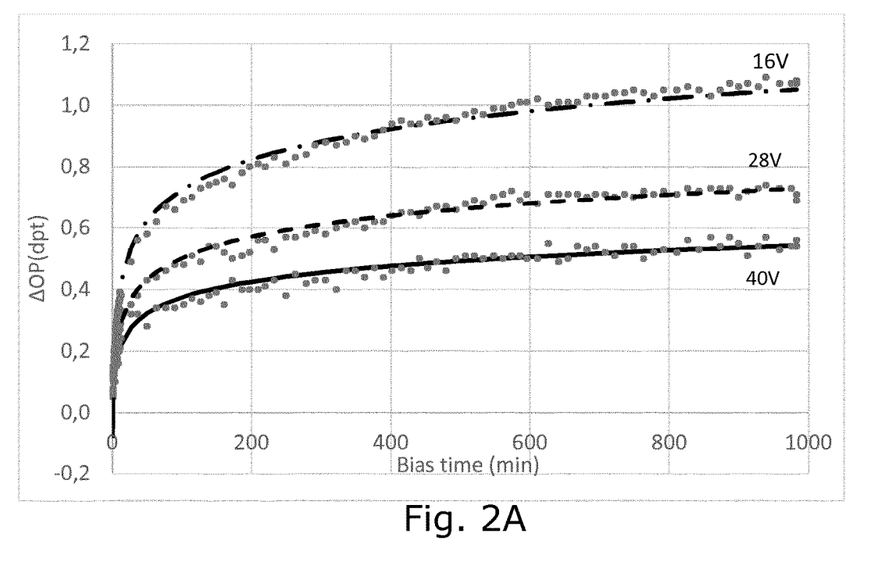
Figure 2B:
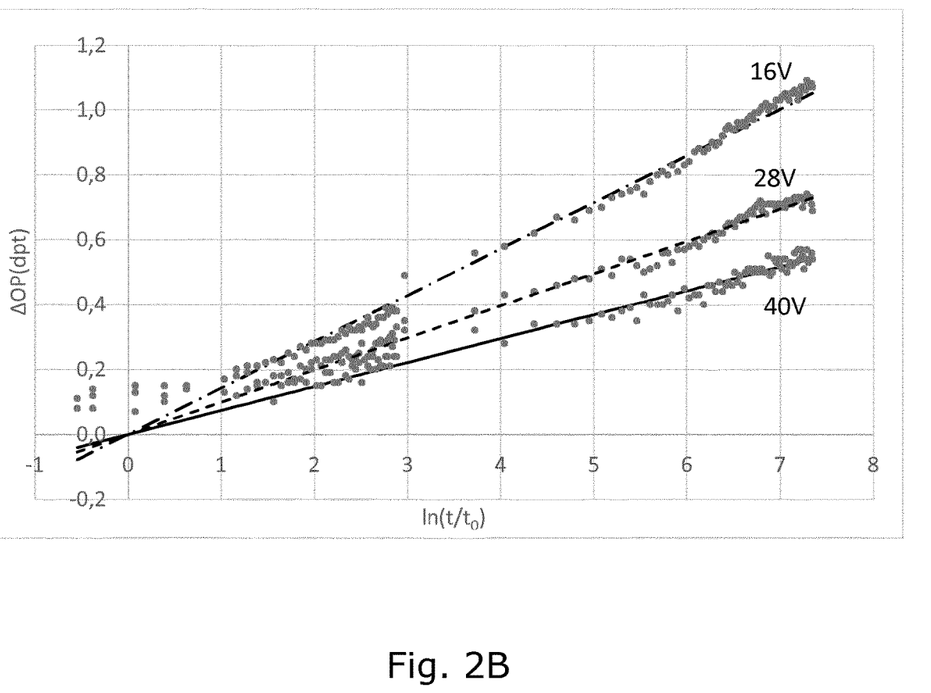

Piezo creep is a well known effect in piezoelectric materials, see e.g. J. Minase, T. F. Lu, B. Cazzolato, and S. Grainger, "Adaptive identification of hysteresis and creep in piezoelectric stack actuators," *Int. J. Adv. Manuf. Technol.*, vol. 46, no. 9-12, pp. 913-921, February 2010, and Y. Liu, J. Shan, U. Gabbert, and N. Qi, "Hysteresis and creep modeling and compensation for a piezoelectric actuator using a fractional-order Maxwell resistive capacitor approach," Smart Mater. Struct., vol. 22, no. 11, p. 115020, November 2013. For the tunable lens, a change in the optical power (the deformation of the piezo) with voltage history is observed, see FIGS. 2A and B. The creep level or rate is dependent of parameters such as bias voltage, duty cycle, temperature during biasing, frequency and on variations in material and the actual signal voltage.

Whereas the PEA itself only has small variations with temperature, the oscillation frequency of the ASIC and other parts such as molded plastic lenses in the camera module, vary significantly with temperature. These variations, however, are either well documented from the manufacturer or can be measured and calibrated for using with the current temperature.

The above three specific phenomena can be compensated by using some or all of the following:
- Calibrating the camera module/driver system and recording a tt(V) curve
- Measuring a current temperature and using it for compensation
- Determining a d(V) curve and calculating a d(tt) curve
- Applying a creep compensation algorithm, including measurements of transition times, capacitance or similar from the driver
- Applying a hysteresis compensation algorithm The following describes one possible implementation of the above steps that can be used in an embodiment of the present invention. Others are possible and may also be applied in embodiments of the invention.

For the calibration of the camera module a test chart is set up at a macro position (e.g. 10 cm), and at an "infinity" position (e.g. 2 m). The DAC value (voltage) to reach maximum sharpness at each distance is recorded and stored to establish two points on the d(V) curve. The calibration procedure can involve starting from $V_{min}$, measuring the maximum sharpness at infinity ($V_{infinity}$) on the upward voltage curve ($d_\uparrow(V)$, lower hysteresis), then go to $V_{max}$, and find the maximum sharpness at macro ($V_{macro}$) on the downward voltage curve ($d_\downarrow(V)$, upper hysteresis curve), or vice versa, in order to have one point on the upper and one on the lower hysteresis curve. The voltage steps should be done in small enough steps to give the required accuracy in the calibrated values, and the sequence should be from $V_{min}$ and upwards, until $V_{max}$, then downwards until both values are located.

In addition, preferably as a separate sequence of operations, the transition time (tt) can be recorded for several voltage steps going up and going down in voltage to determine a relation tt(V). The used charging/discharging current need not be known if it is the same for all measurements. Alternatively, it can vary, but then it need to be known so that tt can be adjusted accordingly. The sequence and size of the voltage steps can vary in order to give the optimal reading of transition time vs voltage. At this step, the current temperature can also be determined, e.g. from the image sensor of via the temperature dependence of the oscillator frequency of the ASIC.

In an alternative embodiment, the PEA capacitance can be measured using a small (100 mV to 1V) superimposed AC voltage. In this embodiment the complex impedance of the PEA is measured, and the (change in) capacitance is deduced. Using a superimposed AC would enable capacitance measurement at constant actuator voltage, which is not possible with the transition time measurement. This method, however, requires a more complex ASIC.

A typical or template d(V) curve can be provided in storage and fitted to the two calibrated values $V_{macro}$ and $V_{infinity}$ values from the calibration to estimate d(V) over the whole voltage range. This curve is then used along with the tt(V) curve from the second part of the calibration (corrected for the current temperature) to calculate the characteristic d(tt) relation for the given camera module. This characteristic relationship is stored, either as a table of data or as a sequence of parameters that determine the curve with good accuracy (polynomial).

Figure 3A:
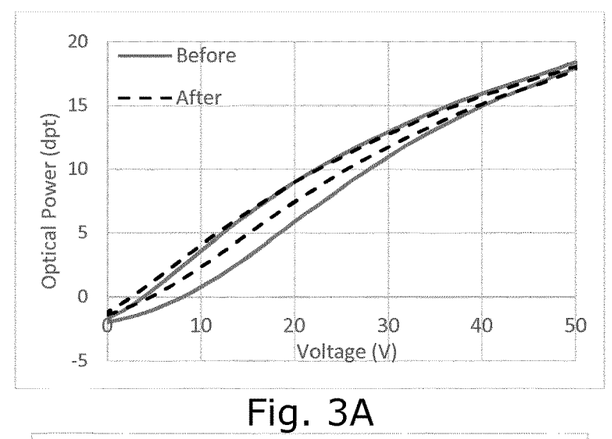
FIG. 3A-C are graphs illustrating hysteresis and creep effects in relations between optical power and voltage (3A) and capacitance and voltage (3B) before (full curves) and after (dashed curves) 2 days biasing at 85° C., whereas the relation between optical power and capacitance (3C) shows no hysteresis and creep effects. In the nomenclature of the description.
Figure 3B:
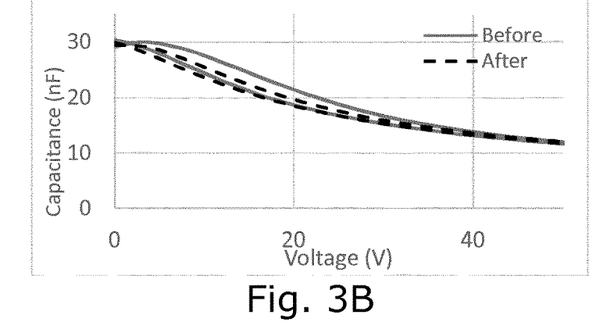

FIGS. 3A and 3B illustrate hysteresis and creep effects in relations between optical power and voltage (3A) and capacitance and voltage (3B), showing the relations before (full curves) and after (dashed curves) a 2 days biasing at 85° C. (corresponding to approximately 1 year of use in a typical mission profile for a mobile phone camera user).

Figure 3C:
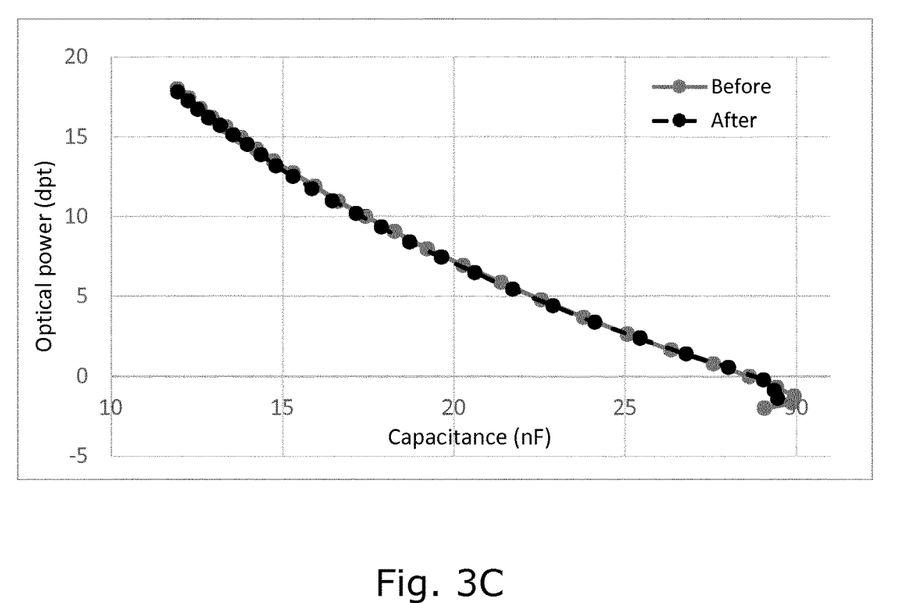

In laboratory experiments, it has been shown that at a given temperature, the optical power vs capacitance relationship is a characteristic for a given lens, which has two important features:
- The relation OP vs. capacitance (FIG. 3C) has no hysteresis, even though both OP vs. voltage (FIG. 3A) and capacitance vs. Voltage (FIG. 3B) has significant hysteresis.
- After a certain period of biasing, and subsequent creep in piezo strength, and thereby displacement/optical power at a given voltage, both the OP and the capacitance is shifted. However, the values follow the same characteristic curve for the specific lens, see FIG. 3C.

That the optical power vs capacitance relationship is a characteristic for at a given temperature, also means that the temperature should ideally be the same during the initial calibration and the later calculation of the compensated relation $d_c(V)$. Since this is usually not practically possible, the temperature of the PEA can be recorded during the initial calibration and at the time of determining $tt_{new}(V)$. Then, the determined relations can be compensated for the difference in temperature before calculating the compensated relation $d_c(V)$. The clock frequency of the PEA driver varies with temperature in a predictable fashion, and assuming that the PEA and PEA driver has the same temperature, a temperature of the driver and thus the PEA can be estimated by measuring this clock frequency.

Figure 4A:
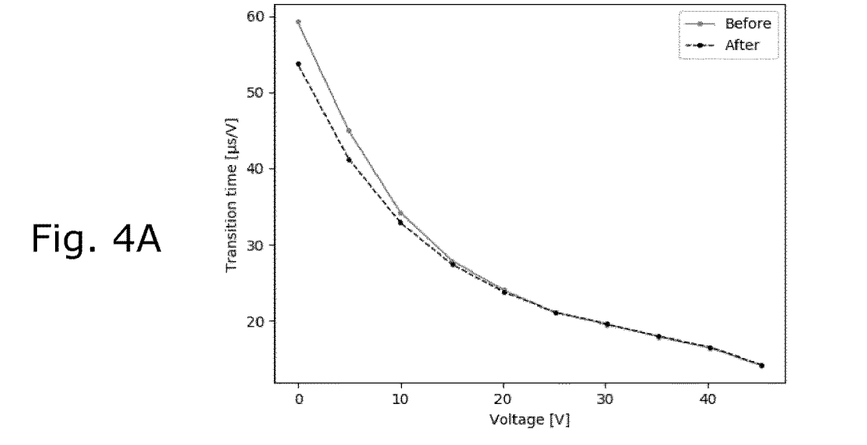
FIGS. 4A-C are graphs illustrating relations between transition time and voltage (4A), optical power and voltage (4B), and optical power and transition time (4C) before (full curves) and after (dashed curves) 2 days biasing at 85° C. In the nomenclature of the description.
Figure 4B:
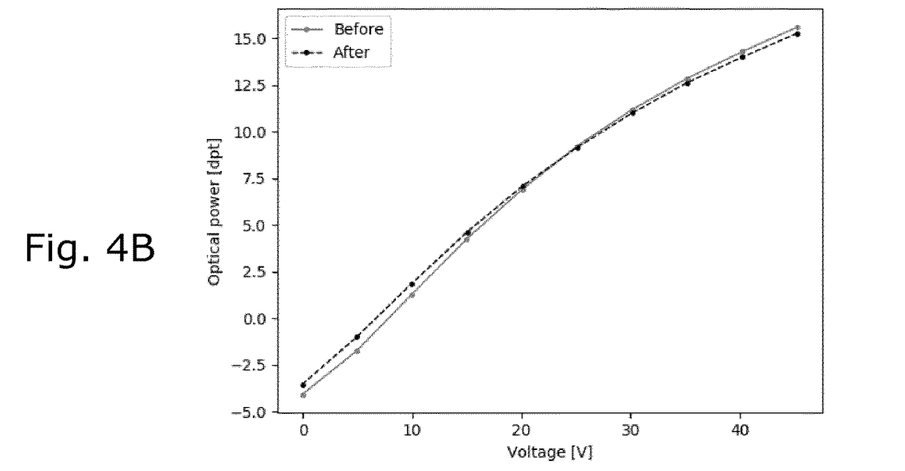
Figure 4C:
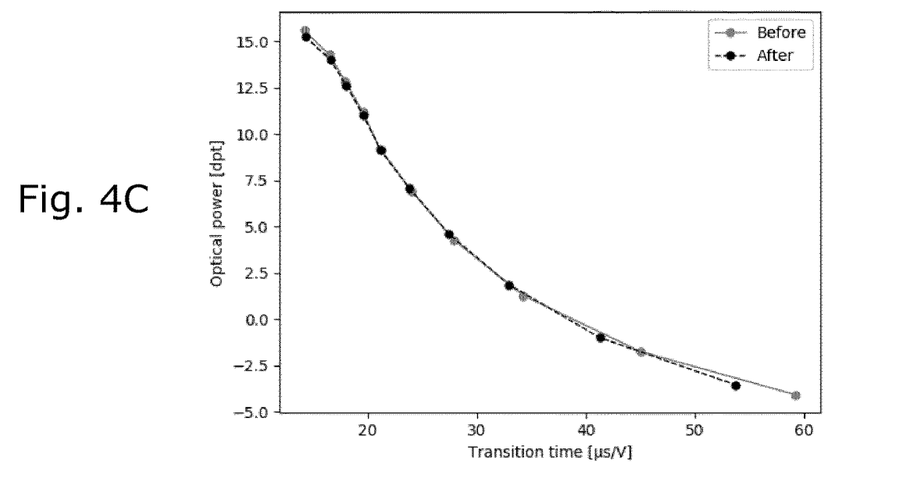

The capacitance is, however, not a value that can be easily measured during real life operation in a camera module. We have discovered that for a given actuation system, the optical power (displacement measure) is correlated with the transition time in the same way as with capacitance. Hence, for practical purposes, the OP vs. capacitance relation can be replaced by a displacement measure vs. transition time relation, d(tt). This is illustrated in FIGS. 4A-C showing tt(V) (FIG. 4A), OP(V) (FIG. 4B), and OP(tt) (FIG. 4C) before (full curves) and after (dashed curves) 2 days biasing at 85° C. as for FIGS. 3A-C.

This means that the characteristic relation d(tt)—calculated from d(V) and tt(V) during camera module calibration—is invariant to the biasing history. Therefore, at any later stage, the current hysteresis curve, $d_c(V)$ for a specific actuator system can be determined from the characteristic relation d(tt) by measuring the transition time vs. voltage relation at any time in the life time of the camera module. This determined current hysteresis curve will thus be compensated for creep effects from the biasing history. Such tt(V) measurement can be performed by the software controlling the piezo driver, by applying a sequence of voltages to the PEA and measure the transition times between the voltages. This measurement can typically take 5-100 ms, depending on the number of steps and repetitions, and can be carried out during the initialization of the camera module before use.

In an optional additional compensation, the compensated curve, $d_c(V)$, may be used as input to the hysteresis compensation described hereunder.

In the following, a method for compensating hysteresis according to an embodiment of the invention is described. The method is described in relation to a camera module, and uses as a starting point either the typical d(V) fitted to by use of at least the calibration values $V_{macro}$ and $V_{infinite}$, or the compensated $d_c(V)$.

The actuator system receives either a setpoint optical power (or focus distance or other displacement measure), $d_{sp}$, or a setpoint voltage, $V_s$, since there, in the absence of hysteresis, is a one to one mapping between voltage and displacement. If a setpoint voltage is received, a target optical power is determined from the upward optical power v voltage curve, $d_\uparrow(V)$. The object of the method is to search for and find a hysteresis compensated voltage, $V_{hc}$, that will produce the setpoint or target optical power when applied to the PEA.

Voltage turning points are the voltage positions where the difference between input voltage have changed, from increments to decrements or vice versa. The actuator system also receives the history information, that is the last upper and lower voltage turning points, $V_{upper}$ and $V_{lower}$, that the new input voltage lies between. At this stage, it is checked if $d_{sp}$ lies between the optical power values at the last upper and lower voltage turning points, $d_{upper}$ and $d_{lower}$. If it does not lie between these values, then previous upper and lower turning points are taken from the history information, until turning points are found that $d_{sp}$ lies between. It is also checked at this stage if there is a new turning point i.e. if the direction of voltage increment has changed. The current upper or lower turning point is then updated and the previous turning point added to the turning point buffer. The defined voltage range [$V_{lower}$; $V_{upper}$] is then used for a binary search.

The binary search starts at $V_s$ and the corresponding optical power is calculated by getting the optical power corresponding to a calculated hysteresis ratio, r(V), as will be defined in more detail in the following sections.

Figure 5:
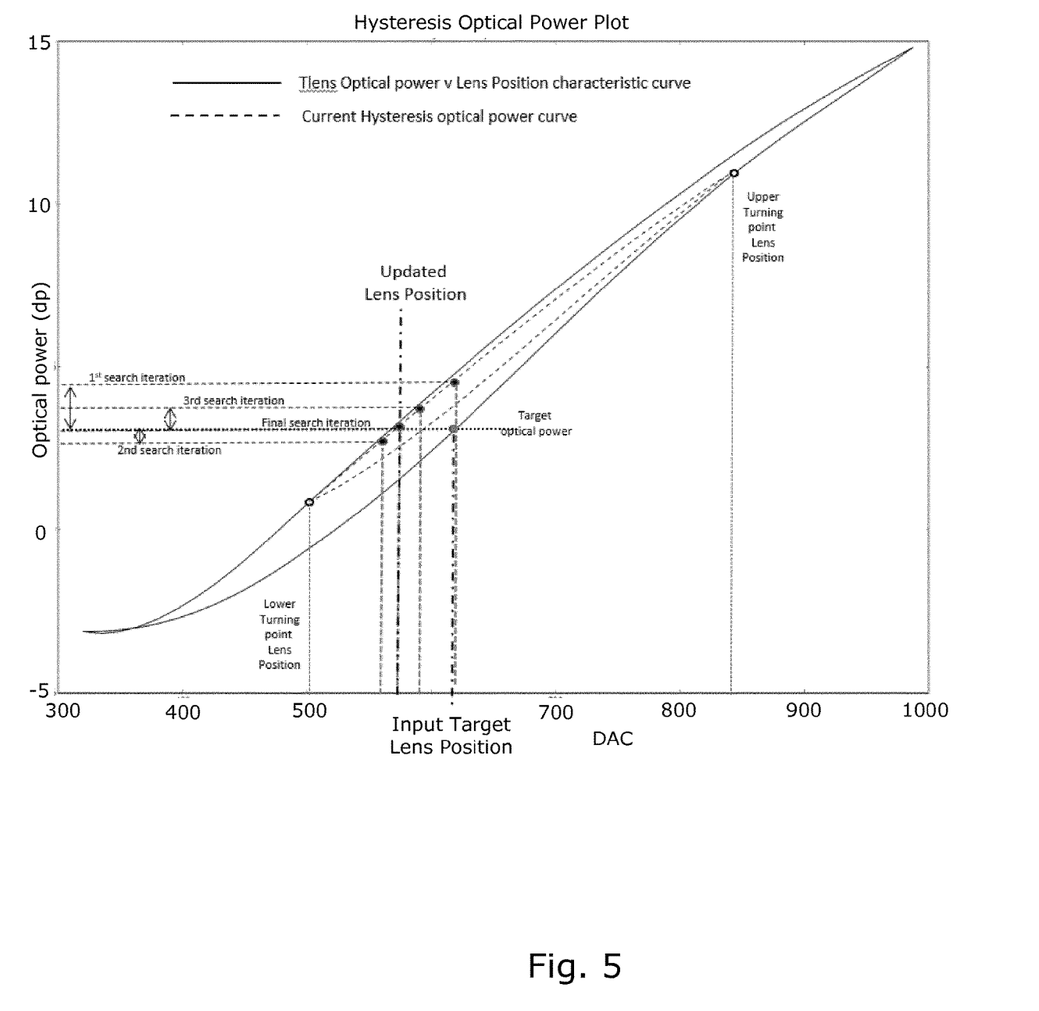
FIG. 5 illustrates the binary voltage search according to an embodiment of the invention.

If the calculated optical power from the current iteration is outside a preset threshold distance from the target optical power, then a new input voltage is calculated. If the calculated optical power is less than the target optical power, then the lower end of the search range is set to the last input voltage, otherwise the upper end of the search range is set to the last input voltage. The new input voltage for the next iteration is then calculated from the mean of the upper and lower ends of the search range. The search iterates until the calculated optical power is within the threshold of the target optical power at which point this voltage value is output as the updated hysteresis corrected voltage. This process is a normal binary search and is illustrated in FIG. 5.

Figure 6:
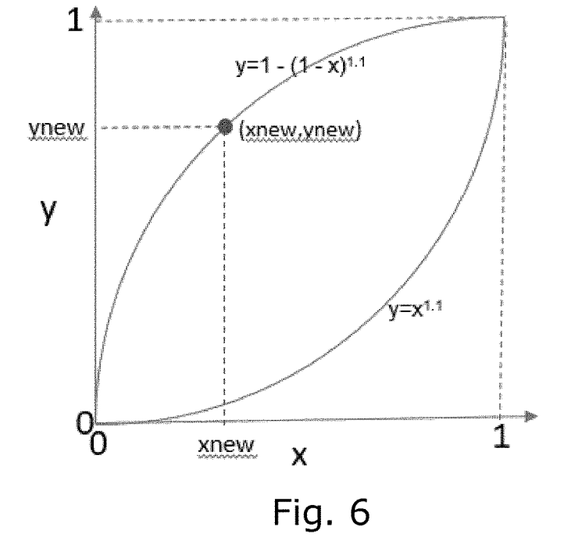
FIG. 6 illustrates the hysteresis model and current hysteresis position relative to the current turning points according to an embodiment of the invention.

The hysteresis ratio calculation consists of the following calculations
First it is checked if the input voltage is beyond either upper or lower voltage turning point in which case turning point needs to be changed to next ones from turning point buffer.
Then the normalized position of the voltage between the voltage turning points, $V_n$, is calculated using the formula $$V_n = \left(\frac{V - V_{lower}}{V_{upper} - V_{lower}}\right)$$

where V is the input voltage, $V_{lower}$ is the lower turning point voltage and $V_{upper}$ the upper turning point voltage.

The upward direction and downward direction value of the displacement hysteresis ($d_n$) is modeled by the following formulae (here using the empirically determined n=1, 1):
Upward:

$$d_{n\uparrow} = V_n^{1.1}$$

Downward:

$$d_{n\downarrow} = 1 - (1 - V_n)^{1.1}$$

where $0 \leq d, V \leq 1$. This is illustrated in FIG. 6 showing the hysteresis model and current hysteresis position relative to the current turning points.

Figure 7:
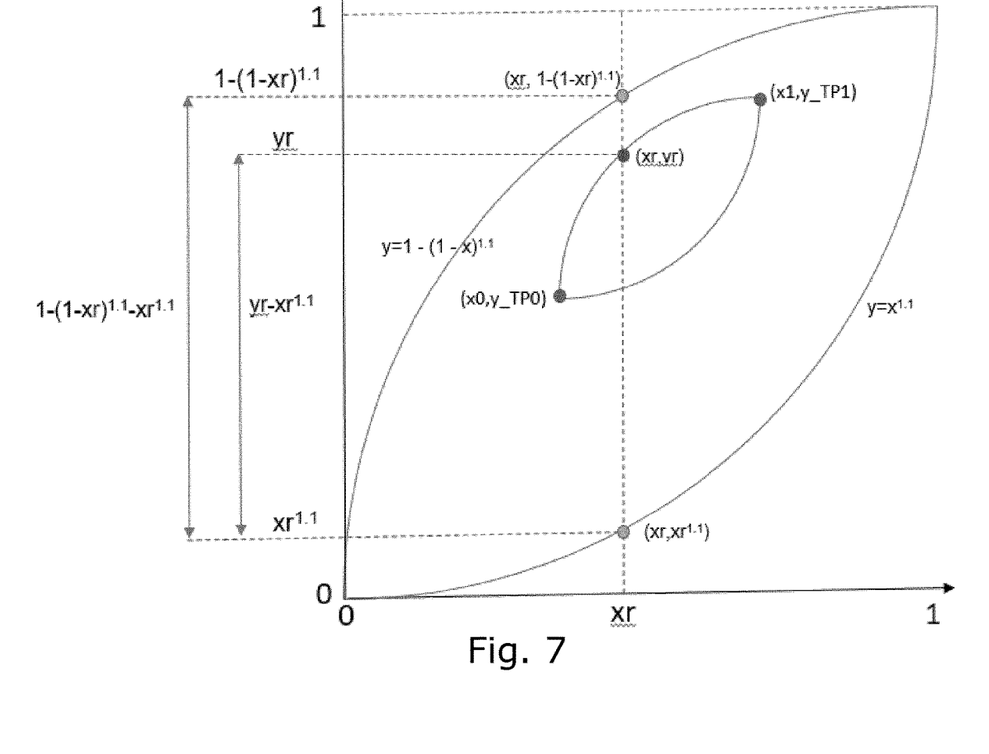
FIG. 7 illustrates the hysteresis ratio calculation according to an embodiment of the invention.

$V_n$ and $d_n$ represents the hysteresis position between the current turning points. The position of this point ($V_n$, $d_n$) is then recalculated within the overall voltage range—minimum voltage to maximum voltage—using the formulae:

$$V_r = \left(\frac{V - V_{min}}{V_{max} - V_{min}}\right)$$

$$d_r(V) = d_n(V) \cdot (d_n(V_{lower}) - d_n(V_{upper})) + d_n(V_{upper})$$

where $d_r(V_{upper})$ and $d_r(V_{lower})$ are the hysteresis model $d_r$ values corresponding to the lower and upper turning points and $0 \leq d_r \leq 1$. $d_r$ should lie between the hysteresis model curve limits of $V_r^{1.1}$ and $1-(1-V_r)^{1.1}$. This is illustrated in FIG. 7.

The output hysteresis ratio, is the ratio of the distance from $d_r$ to the lower hysteresis curve divided by the distance between the lower and upper curves at $V_r$ and is calculated using the formula:

$$r(V) = \frac{d_r(V) - V_r^{1.1}}{1 - (1 - V_r)^{1.1} - V_r^{1.1}}$$

This is illustrated in FIG. 7.

Figure 8:
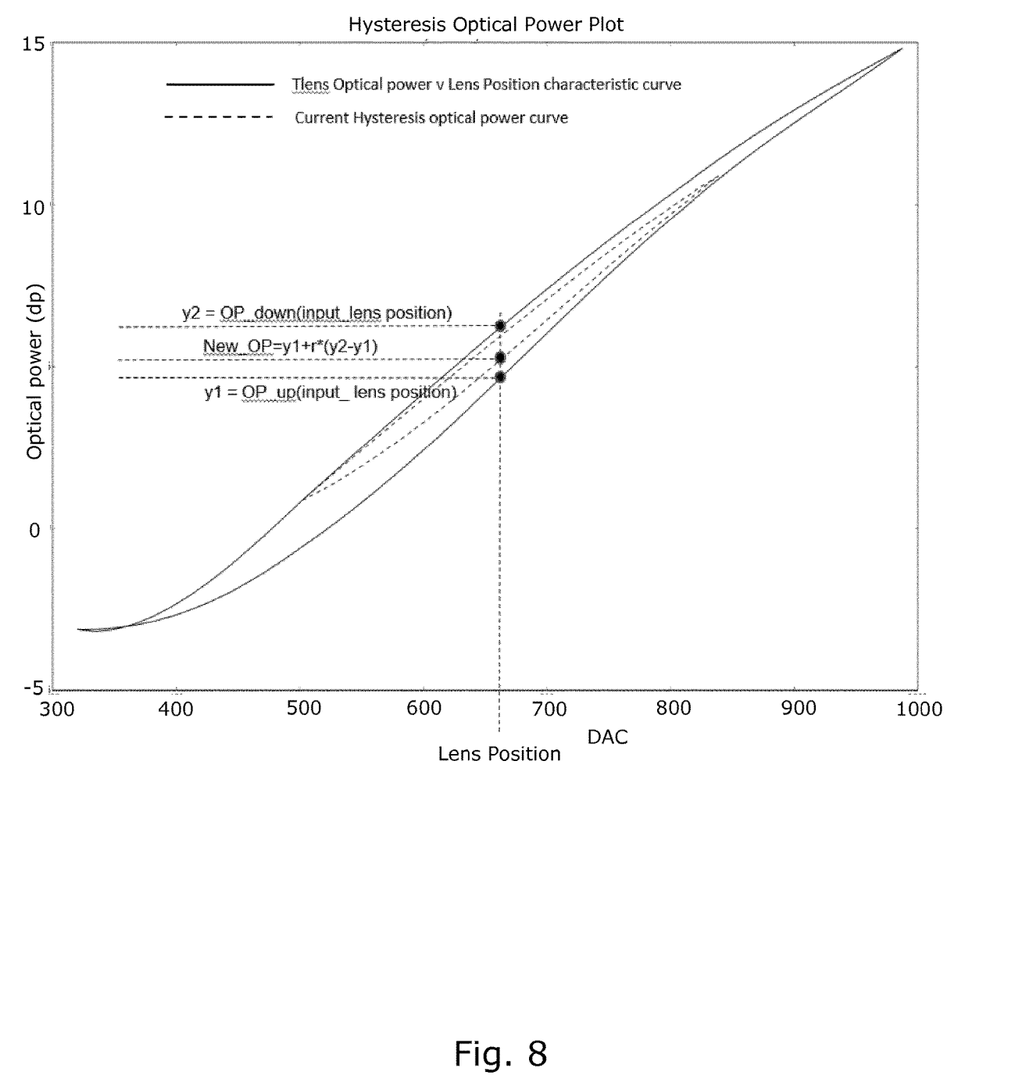
FIG. 8 illustrates how the new optical power is determined from the hysteresis ratio according to an embodiment of the invention.

Once the hysteresis ratio has been calculated. Then the optical power corresponding to an input voltage in the binary voltage search is determined by applying this ratio to the upper and lower optical power v voltage curves for the input voltage value, using the formula:

$$d_s(V) = d_\uparrow(V) + r(V)(d_\downarrow(V) - d_\uparrow(V))$$

where $d_\uparrow(V)$ is the optical power at the input voltage on the upward optical power curve and $d_\downarrow(V)$ is the optical power at the input voltage on the downward optical power curve. This optical power is then checked in the binary search if it is within the threshold of the target optical power, otherwise a new search iteration is started. This is illustrated in FIG. 8.

Figure 9:
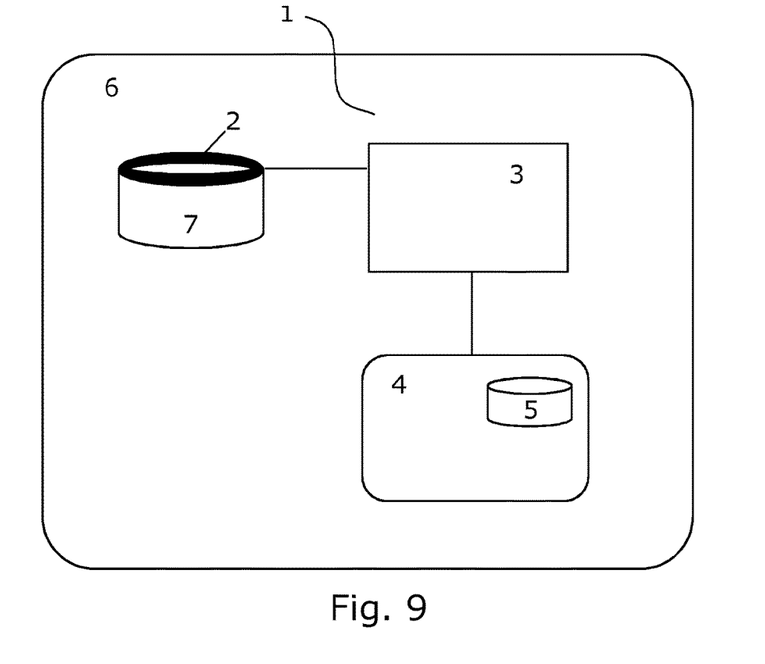
FIG. 9 illustrates an actuating system and a camera module in accordance with different embodiments of the invention.

FIG. 9 illustrates an actuator system 1 according to an embodiment of the invention comprising a PEA 2, a piezo driver 3 connected to drive the PEA, and a processing unit 4 connected to the piezo driver and holding software for controlling the piezo driver. The software can be stored in memory 5 being part of the processing unit.

In a preferred embodiment, the actuator system 1 is combined with an adjustable focus lens assembly 7 to form part of a camera module 6. Here, the PEA can be a piezo electric film arranged on a flexible membrane to deform a shape of the membrane upon actuation of the PEA.

Figure 10:
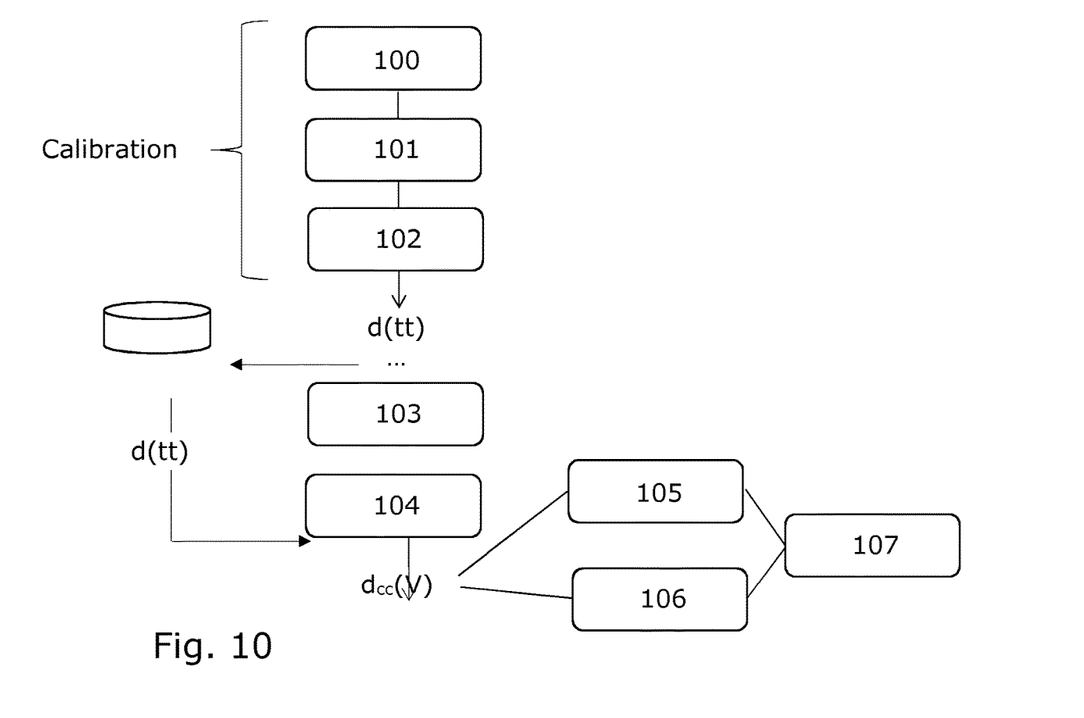
FIG. 10 is a flowchart illustrating a method according to an embodiment of the invention.

FIG. 10 is a flow chart illustrating the method and the software algorithms for compensating for piezo creep when applying a voltage to a PEA according to embodiments of the invention. The flow chart illustrates the steps of:

100 determining a relation $d_{cal}(V)$ between a PEA displacement measure (d) and voltage (V)

101 determining a relation $tt_{cal}(V)$ between transition time (tt) and voltage 102 combining $d_{cal}(V)$ and $tt_{cal}(V)$ to calculate a relation d(tt) between the displacement measure and transition time, and storing d(tt)

After repeated biasing:

103 determining a new relation $tt_{new}(V)$ between transition time and voltage 104 retrieving d(tt) and substituting $tt_{new}(V)$ in d(tt) to calculate a new compensated relation $d_c(V)$;

105 using the compensated relation, $d_c(V)$ directly to determine a voltage to be applied to the PEA to achieve a given setpoint displacement $d_{sp}$; or 106 using the compensated relation, $d_c(V)$ as an input to further compensations algorithms, such as hysteresis compensation, and determining a voltage to be applied 107 applying the determined voltage to the PEA.

The invention claimed is:

1. A method for determining and applying a voltage to a piezoelectric actuator (PEA) to achieve a given setpoint displacement, the method comprising:

determining, during an initial calibration procedure, a relation $d_{cal}(V)$ between a PEA displacement measure (d) and voltage (V) and a relation $tt_{cal}(V)$ between transition time (tt) and voltage, wherein the transition time is a charging or discharging time ΔT between two voltages $V_A$ and $V_B$ applied to the PEA, and wherein the relations are determined for both increasing and decreasing voltages to map hysteresis, and combining the determined relations to calculate a relation d(tt) between the displacement measure and transition time;

determining, after repeated biasing of the PEA, a new relation $tt_{new}(V)$ between transition time and voltage, and substituting $tt_{new}(V)$ in the calculated d(tt) to calculate a compensated relation $d_c(V)$;

providing a setpoint displacement measure, $d_{sp}$ or voltage $V_s$;

determining, using the compensated relation, $d_c(V)$, a voltage to be applied to the PEA to achieve $d_{sp}$ or a displacement measure derived from $V_s$; and applying the determined voltage to the PEA.

2. The method according to claim 1, wherein the step of determining the voltage to be applied to the PEA comprises using $d_c(V)$ in a hysteresis compensation algorithm to determine a hysteresis compensated voltage, $V_{hc}$, to be applied to the PEA to achieve $d_{sp}$.

3. The method according to claim 2, wherein the hysteresis compensation algorithm comprises:

using $d_c(V)$ for increasing, $d_{\uparrow c}(V)$, and decreasing, $d_{\downarrow c}(V)$, voltages determining maximum and minimum voltages, and $V_{max}$ and $V_{min}$, of $d_c(V)$ as well as providing historical data comprising last upper and lower turning points, $V_{upper}$ and $V_{lower}$;

using a first hysteresis model function $d_n(V)$ with V being normalized as $$V_n = \left(\frac{V - V_{lower}}{V_{upper} - V_{lower}}\right):$$

$$d_{n\uparrow} = V_n^{1,1}$$

$$d_{n\downarrow} = 1 - (1 - V_n)^{1,1},$$

and a second hysteresis model function $d_r(V)$ with V being normalized as $$V_r = \left(\frac{V - V_{min}}{V_{max} - V_{min}}\right):$$

$V_r = (V - V_{min}/V_{max} - V_{min})$: $d_r(V) = d_n(V) \cdot (d_n(V_{lower}) - d_n(V_{upper})) + d_n(V_{upper})$, determining a hysteresis ratio r:

$$r(V) = \frac{d_r(V) - V_r^{1,1}}{1 - (1 - V_r)^{1,1} - V_r^{1,1}};$$

providing a setpoint displacement measure, $d_{sp}$, for the PEA and determining a corresponding voltage, $V_s$, from $d_{\uparrow c}(V)$; and selecting a search range as the interval $[V_{min}; V_{lower}]$, $[V_{lower}; V_{upper}]$, or $[V_{upper}; V_{max}]$ in which $V_s$ falls, and performing a binary search algorithm using the function $d_s(V) = d_{\uparrow c}(V)(d_{\downarrow c}(V) - d_{\uparrow c}(V))$ within the selected range and starting at $V_s$ to determine a hysteresis compensated voltage, $V_{hs}$, yielding a displacement measure within a preset threshold from $d_{sp}$.

4. The method according to claim 1, further comprising recording a temperature of the PEA during the initial calibration and at the time of determining $tt_{new}(V)$, and compensating for the temperature dependencies of the determined relations before calculating the compensated relation $d_c(V)$.

5. The method according to claim 1, wherein the PEA actuator forms part of an adjustable focus lens assembly in a camera module, and wherein the step of determining the voltage to be applied to the PEA using the compensated relation, $d_c(V)$, comprises obtaining a current temperature and selecting a corresponding temperature compensation parameter for additional lenses in the camera module from a list.

6. The method according to claim 1, wherein the determination of the voltage to be applied to the PEA is an open-loop process.

7. The method according to claim 1, wherein determining the relation $d_{cal}(V)$ during an initial calibration procedure comprises determining at least two calibration pairs by measuring voltages corresponding to at least two calibration displacement measures, and fitting a typical d(V) curve to the determined calibration pairs.

8. The method according to claim 1, wherein the PEA actuator system is used to control an adjustable focus lens assembly in a camera module and the displacement measure is a sharpness score or focus distance of the camera module.

9. An actuator system comprising a piezoelectronic actuator (PEA), a piezo driver connected to drive the PEA, and a processing unit connected to the piezo driver and holding software for controlling the piezo driver, wherein:

the processing unit further holds a relation d(tt) between a displacement measure (d) and transition time (tt) established during an initial calibration of the actuator system, wherein the transition time is a charging or discharging time $\Delta T$ between two voltages $V_A$ and $V_B$ applied to the PEA; and the software is configured to, after repeated biasing of the PEA, control the driver to apply a sequence of voltages to the PEA and measure the transition times between the voltages to determine a relation $tt_{new}(V)$ between transition time and voltage (V), and to substitute $tt_{new}(V)$ in d(tt) to calculate a compensated relation $d_c(V)$.

10. The actuator system according to claim 9, wherein the software is further configured to:

receive a setpoint displacement measure, $d_{sp}$ or voltage $V_s$;

determine, using the compensated relation, $d_c(V)$, a voltage to be applied to the PEA to achieve $d_{sp}$ or a displacement measure derived from $V_s$; and send the determined voltage to a DAC in the piezo driver.

11. The actuator system according to claim 10, wherein the software is open loop in that it determines the voltage to be applied to the PEA without a feedback loop wherein a displacement measure resulting from a voltage applied to the PEA is compared to the setpoint displacement measure.

12. The actuator system according to claim 9, wherein the PEA actuator system is used to control an adjustable focus lens assembly in a camera module and the displacement measure is a sharpness score or focus distance of the camera module.

13. The actuator system according to claim 12, wherein the adjustable focus lens assembly comprises a bendable transparent lens cover, a transparent back window and a transparent, deformable lens body sandwiched between the lens cover and the back window to form a lens, and wherein the PEA a piezo film on the lens cover for changing an overall shape of the lens.

* * * * *